(12) United States Patent
Sun et al.

(10) Patent No.: US 7,916,758 B2
(45) Date of Patent: *Mar. 29, 2011

(54) METHOD AND SYSTEM FOR PRECISE-CLOCK SYNCHRONIZATION, AND DEVICE FOR PRECISE-CLOCK FREQUENCY/TIME SYNCHRONIZATION

(75) Inventors: Wenhua Sun, Shenzhen (CN); Xiaobo Wang, Shenzhen (CN); Jihui Wang, Shenzhen (CN); Wenguang Xu, Shenzhen (CN); Shengbing Yang, Shenzhen (CN); Youhao Deng, Shenzhen (CN); Bingbo Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 12/904,754

(22) Filed: Oct. 14, 2010

(65) Prior Publication Data

US 2011/0019699 A1 Jan. 27, 2011

Related U.S. Application Data

(63) Continuation of application No. 12/582,002, filed on Oct. 20, 2009.

(30) Foreign Application Priority Data

Oct. 21, 2008 (CN) .......................... 2008 1 0224615

(51) Int. Cl.
*H04J 3/06* (2006.01)
(52) U.S. Cl. ....................................... 370/503; 375/354

(58) Field of Classification Search .......... 370/503–516; 375/293, 294, 354, 373–376

See application file for complete search history.

(56) References Cited

U.S. PATENT DOCUMENTS 7,711,009 B2 * 5/2010 Kataria et al. ................ 370/503
(Continued)

FOREIGN PATENT DOCUMENTS

CN 1383299 A 12/2002
(Continued)

OTHER PUBLICATIONS

"Draft Standard for a Precision Clock Synchronization Protocol for Networked Measurement and Control Systems," IEEE P1588™ D2.2, dated 2007.

*Primary Examiner* — Ricky Ngo
*Assistant Examiner* — Pao Sinkantarakorn
(74) *Attorney, Agent, or Firm* — Conley Rose, P.C.; Grant Rodolph

(57) ABSTRACT

A precise-clock synchronization method and system and a precise-clock frequency/time synchronization device are provided. In the embodiments of the present invention, two time stamp engines are provided at a slave clock side. A relative time stamp engine provides a relative arrival time stamp. An absolute time stamp engine provides an absolute arrival time stamp. The frequency/time synchronization is calculated by using different time stamps obtained from different time stamp engines, so the frequency synchronization and time synchronization of the master clock and the slave clock may be separately accomplished, and one synchronization function may be enabled or disabled. Therefore, the frequency synchronization and time synchronization of the master clock and the slave clock do not interfere with each other, thus greatly reducing the occupied link bandwidth resources.

8 Claims, 9 Drawing Sheets

U.S. PATENT DOCUMENTS

| | | |
|---|---|---|
| 2003/0039272 A1 | 2/2003 | Dudziak et al. |
| 2003/0063625 A1 | 4/2003 | Belk et al. |
| 2003/0169776 A1 | 9/2003 | Reesor |
| 2003/0174734 A1 | 9/2003 | Compton et al. |
| 2004/0103226 A1 | 5/2004 | Johnson et al. |
| 2004/0257469 A1 | 12/2004 | Compton et al. |
| 2006/0221936 A1 | 10/2006 | Rauchwerk |
| 2007/0008993 A1* | 1/2007 | Cha et al. ............ 370/509 |
| 2007/0071029 A1 | 3/2007 | White et al. |
| 2007/0147435 A1 | 6/2007 | Hamilton |
| 2007/0195829 A1 | 8/2007 | Akahori |

FOREIGN PATENT DOCUMENTS

| | | |
|---|---|---|
| CN | 1863156 A | 11/2006 |

* cited by examiner

METHOD AND SYSTEM FOR PRECISE-CLOCK SYNCHRONIZATION, AND DEVICE FOR PRECISE-CLOCK FREQUENCY/TIME SYNCHRONIZATION

CROSS-REFERENCE TO RELATED APPLICATIONS

This application is a continuation of U.S. patent application Ser. No. 12/582,002, filed on Oct. 20, 2009, which claims priority to Chinese Patent Application No. 200810224615.7, filed on Oct. 21, 2008, both of which are hereby incorporated by reference in their entireties.

FIELD OF THE TECHNOLOGY

The present invention relates to the field of communication technology, and more particularly, to a method and system for precise-clock synchronization and a device for precise-clock frequency/time synchronization.

BACKGROUND

Internet Protocol (IP)-based communication networks have not reduced demands for clock synchronization. On the contrary, for demands of cost, safety, and services, the IP clock synchronization becomes more and more important. Among the various existing IP clock technologies, such as circuit emulation services over packet switched (CESoP), timing over packet (ToP), network time protocol (NTP), the ToP technology is a relatively new technology. For the IP clock technology, the Institute for Electrical and Electronics Engineers (IEEE) also introduced an IEEE 1588 precision time protocol (PTP) standard. The IEEE 1588 PTP not only inherits the characteristics of performing frequency synchronization on master and slave clocks in the technology above, but also implements time synchronization, that is, phase synchronization.

However, in the IEEE 1588 PTP, it is necessary to collect all time stamps transmitted between the master clock and the slave clock. The time stamps are stamped by the time stamp engines located at the master clock side and the slave clock side. The time stamps mainly include transmitting time and receiving time of information such as a synchronous packet (Sync packet), follow up information (Follow_Up information), delay request (Delay_Req) packet, and a delay response (Delay_Resp) packet. The frequency synchronization adjustment and time synchronization adjustment of the master clock and the slave clock can be performed only after collecting sufficient information of time stamps between the master clock and the slave clock.

In the process of implementing the present invention, the inventor finds that there are at least the following disadvantages in the conventional art. Too much link bandwidth resources are occupied in the aforesaid process. Especially, when the network transmission conditions are deteriorated and the frequency of transmitting packets needs to be increased for frequency synchronization, such a disadvantage that the clock synchronization occupies too much link bandwidth resources becomes more apparent. In addition, when only one time stamp engine exists at the slave clock side, the time of stamping a time stamp at a local position of the slave clock has to be different from the time of the local frequency synchronization; otherwise, due to the local frequency adjustment, the value of the local time stamp is influenced. Therefore, correct calculation is not able to be performed according to the obtained time stamps, and the frequency synchronization/time synchronization is thus influenced.

SUMMARY

Embodiments of the present invention provide a precise-clock synchronization method and system and a precise-clock frequency/time synchronization device, so that the frequency synchronization and time synchronization of the clocks do not interfere with each other, and the occupied link bandwidth resources are greatly reduced.

In an embodiment, the present invention provides a precise-clock synchronization method, which includes the following steps.

A time stamp is obtained. The time stamp includes at least an original time stamp about the time when a master clock side transmits each synchronous packet (Sync packet) and a relative arrival time stamp about the time that a slave clock side receives each Sync packet.

It is determined whether a clock frequency at the slave clock side and a clock frequency at the master clock side are synchronous or not according to each original time stamp and the corresponding relative arrival time stamp.

If the clock frequency at the slave clock side and the clock frequency at the master clock side are asynchronous, the clock frequency at the slave clock side is adjusted to become synchronous with the clock frequency at the master clock side.

In another embodiment, the present invention provides a precise-clock frequency synchronization device. The precise-clock frequency synchronization device includes a relative time stamp engine, a first obtaining module, a determining module, and a frequency adjusting module.

The relative time stamp engine is adapted to provide a relative arrival time stamp about the time when a slave clock side receives a Sync packet.

The first obtaining module is adapted to obtain a time stamp. The time stamp includes at least an original time stamp about the time when the master clock side transmits each Sync packet and a relative arrival time stamp about the time when the slave clock side receives each Sync packet.

The determining module is adapted to determine whether a clock frequency at the slave clock side and a clock frequency at the master clock side are synchronous or not according to each original time stamp and its corresponding relative arrival time stamp.

The frequency adjusting module is adapted to adjust the clock frequency at the slave clock side to be synchronous with the clock frequency at the master clock side if the clock frequency at the slave clock side and the clock frequency at the master clock side are asynchronous.

In another embodiment, the present invention provides a precise-clock time synchronization device. The precise-clock time synchronization device includes an absolute time stamp engine, a second obtaining module, a second calculating module, and a time adjusting module.

The absolute time stamp engine is adapted to provide an absolute arrival time stamp about the time when a slave clock side receives a Sync packet and a delay request packet (Delay_Req) time stamp about the time when the slave clock side transmits a Delay_Req.

The second obtaining module is adapted to obtain a time stamp including an original time stamp and an absolute arrival time stamp of the Sync packet transmitted by the master clock side, a Delay_Resp time stamp transmitted by the master clock side, and a Delay_Req time stamp transmitted by the slave clock side.

The second calculating module is adapted to calculate a time offset according to the obtained original time stamp, absolute arrival time stamp, Delay_Req time stamp, and Delay_Resp time stamp.

The time adjusting module is adapted to adjust the clock time at the slave clock side to be synchronous with the clock time at the master clock side by using the time offset.

In another embodiment, the present invention provides a precise-clock synchronization system. The precise-clock synchronization system includes a precise-clock frequency synchronization device and a precise-clock time synchronization device.

The precise-clock frequency synchronization device is adapted to adjust a clock frequency at a slave clock side to be synchronous with a clock frequency at the master clock side according to an original time stamp about the time when the master clock side transmits a Sync packet and a relative arrival time stamp about the time when the slave clock side receives the Sync packet.

The precise-clock time synchronization device is adapted to calculate a time offset according to the original time stamp of the Sync packet and an absolute arrival time stamp about the time when the slave clock side receives the Sync packet, as well as a Delay_Req time stamp and Delay_Resp time stamp, and to adjust the clock time at the slave clock side to be synchronous with the clock time at the master clock side by using the time offset.

As can be seen from the technical solution above, in the embodiments of the present invention, the precise-clock synchronization method and system and the precise-clock frequency/time synchronization device may accomplish frequency synchronization and time synchronization of the master clock and the slave clock independently by using time stamps provided by two different time stamp engines, so that the frequency synchronization and time synchronization of the clocks do not interfere with each other, thus greatly reducing the occupied link bandwidth resources.

The present invention is further illustrated in detail below through specific embodiments with reference to the accompanying drawings.

BRIEF DESCRIPTION OF THE DRAWINGS

To illustrate the technical solutions according to the embodiments of the present disclosure more clearly, the accompanying figures for describing the embodiments are introduced briefly in the following. Apparently, the accompanying drawings in the following description are only some embodiments of the present disclosure; persons of ordinary skill in the art can derive other drawings according to the accompanying drawings without paying any creative efforts.

DETAILED DESCRIPTION OF THE EMBODIMENTS

The technical solutions in the embodiments of the present invention are described clearly below with reference to the accompanying drawings in the embodiments of the present invention. Apparently, the described embodiments are only a part of embodiments of the present invention, rather than all the embodiments. On the basis of the embodiments of the present invention, all the other embodiments obtained by those of ordinary skill in the art without carrying out creative activities fall within the protection scope of the present invention.

Figure 1:
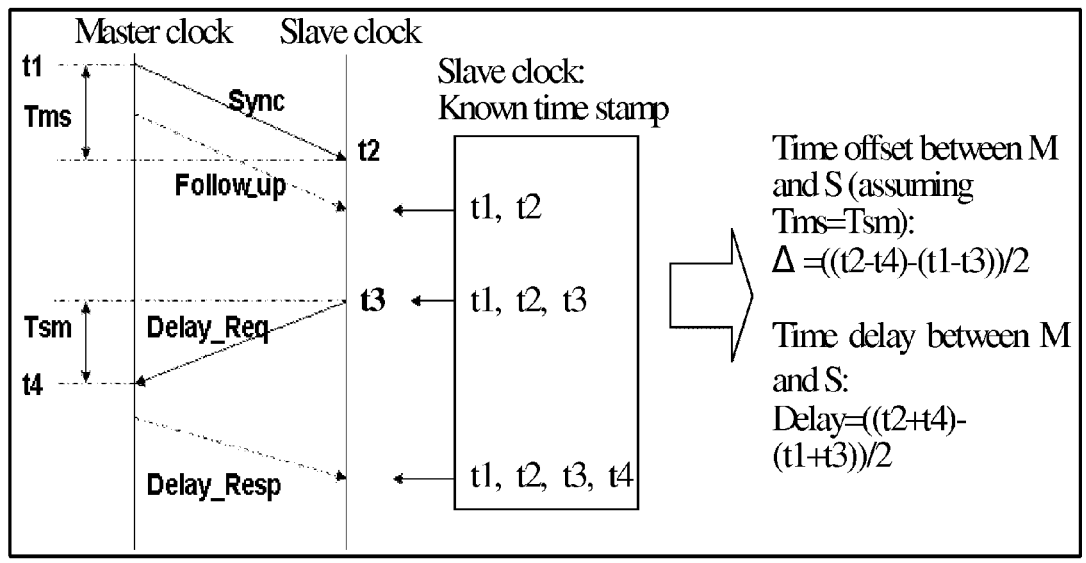
FIG. 1 is a schematic structural view of a synchronization message exchange scheme of the IEEE 1588 PTP.

FIG. 1 is a schematic structural view of a synchronization message exchange scheme of the IEEE 1588 PTP. Referring to FIG. 1, the simple descriptions are provided as follows.

First, a master clock transmits a certain synchronous packet (Sync packet) periodically, usually once every two seconds. The Sync packet includes a time stamp precisely describing an estimated time of transmitting a data packet. A slave clock measures an accurate receiving time t2 for receiving the Sync packet. As the Sync packet includes the estimated time of transmitting the data packet instead of a practical time, the master clock further transmits a piece of Follow_Up information after transmitting the Sync packet. The Follow_Up information is added with a time stamp accurately recording a practical time t1 of transmitting the Sync packet. In such a manner, the slave clock obtains the time stamps t1 and t2 after receiving the Follow_Up information.

Subsequently, the slave clock transmits a delay request packet (Delay_Req) at a time t3 after the Sync packet is received. After the master clock receives the Delay_Req, the master clock carries a time stamp including an accurate receiving time t4 in a delay response packet (Delay_Resp) and transmits the Delay_Resp to the slave clock. In this way, the slave clock obtains the time stamps t1, t2, and t3 when transmitting the Delay_Req, and obtains time stamps t1, t2, t3, and t4 when receiving the Delay_Resp.

The slave clock calculates a time offset between the master clock and the slave clock, and a delay of the transmission link by using the collected t1, t2, t3, and t4. The time offset between the master clock and the slave clock is a value of "Δ" in FIG. 1, and is used to modify a time difference between the master clock and the slave clock. The delay of the transmission link is a value of "Delay" in FIG. 1, and is used to measure a delay time caused by the network transmission. The slave clock utilizes a clock restoration algorithm through the two values, so that the master clock and the slave clock become synchronous in time and frequency.

It should be noted that, the Delay_Req is transmitted randomly, and has no time limits. Also, in the whole process of measurement, it is assumed that the transmission medium is uniform and symmetric.

Figure 2:
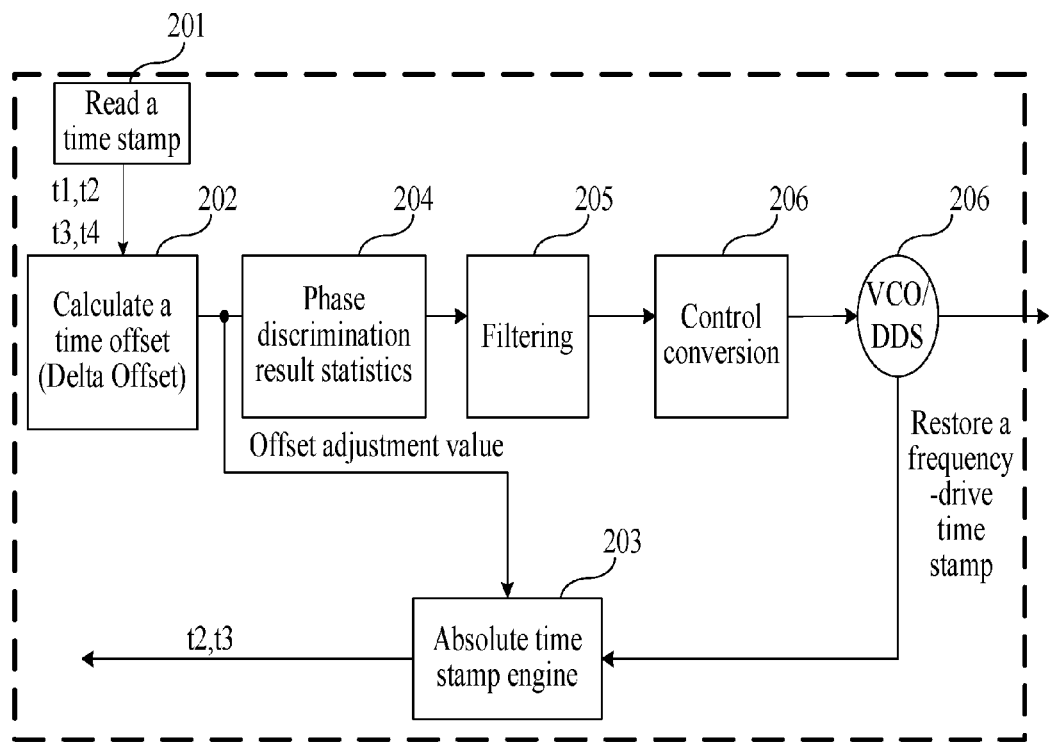
FIG. 2 is a schematic flow chart of a common precise-clock synchronization method.

FIG. 2 is a schematic flow chart of a common precise-clock synchronization method. Referring to FIG. 2, when the exchange of synchronization messages in FIG. 1 is finished, the following steps are performed locally, that is, at the slave clock side.

In step 201, a time stamp is obtained. That is, four time stamps t1, t2, t3, and t4 are obtained.

The t2 and t3 are obtained from a local absolute time stamp engine. The time represented in the absolute time stamp engine is an absolute time, which has to be synchronous with the master clock.

In step 202, a time offset is calculated periodically.

In step 203, time adjustment is performed on the slave clock by directly using the time offset calculated each time, so as to make the time of the slave clock synchronous with the time of the master clock, and update the time of the absolute time stamp engine synchronously.

In step 204, in a certain period, a statistical calculation for phase-discrimination results is performed on the multiple time offsets obtained by periodical calculation, so as to obtain an optimal time offset.

Step 204 and step 203 may be performed at the same time.

In step 205, high frequency components in the time offset obtained in step 204 are filtered, such as a jitter value of the network, or transient value jump occurred due to occasional errors when the time stamp engine processes data, and the changing trend of the time offset is monitored.

Specifically, if the time offset obtained at a later time is always greater than the time offset obtained at a former time, that is, the time offset is in a forward change, it shows that a local drive frequency, that is, the drive frequency of slave-clock timing is higher than that of master-clock timing; otherwise, the drive frequency of the slave-clock timing is lower than that of the master-clock timing.

In step 206, conversion of reverse control is performed according to the changing trend of the time offset, the time offset is converted into a signal that is able to be identified by a local voltage controlled oscillator (VCO) or direct digital synthesizer (DDS), so as to control the adjustment of the local oscillator such as the VCO or DDS. As a negative feedback loop is used, reverse adjustment is performed, so as to realize the frequency synchronization of the master clock and the slave clock, and the frequency synchronization result is used to update the frequency of the absolute time stamp engine synchronously.

After step 203 and steps 204 to 206 are performed, both the time and frequency of the absolute time stamp engine are updated. Next time a local time stamp is obtained from the absolute time stamp engine after synchronous update, and in this embodiment, it is the step of obtaining t2 and t3. Steps 201 to 206 are continuously repeated, until the frequency and time locks a prime reference source, that is, the master clock.

The embodiment of precise-clock synchronization method is characterized in that, only one absolute time stamp engine exists, so the time of the absolute time stamp engine is changed after either time synchronization or frequency synchronization; and all synchronization messages exchanged in FIG. 1 need to be processed, so as to obtain the time offset required in both frequency restoration (frequency synchronization) and time setting (time synchronization).

The solution in the embodiment of the present invention utilizes two time stamp engines. One is a relative time stamp engine, which does not need time setting. The other one is an absolute time stamp engine representing an absolute time. The two time stamp engines are used to perform frequency and time synchronization for the master clock and the slave clock respectively, so that the frequency synchronization and the time synchronization of the master clock and the slave clock may be performed independently. Also, when frequency synchronization is performed for the relative time stamp engine, the synchronization message does not need to be processed.

Figure 3:
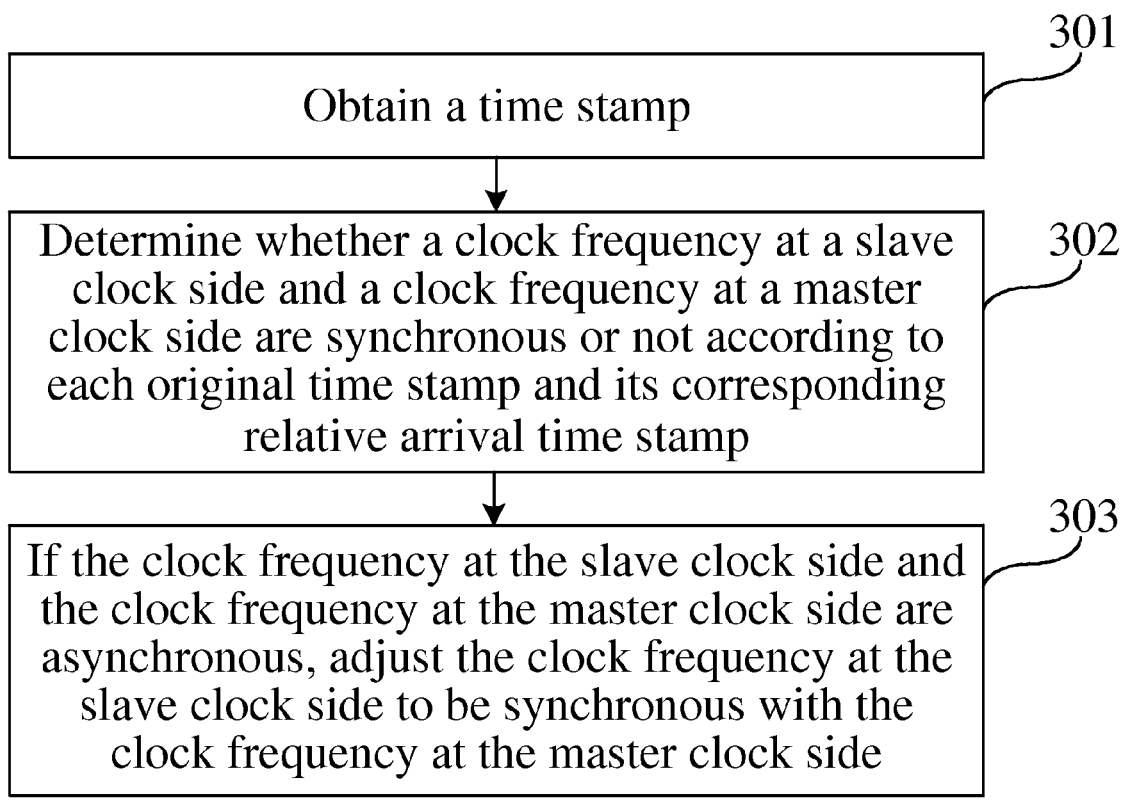
FIG. 3 is a schematic flow chart of a precise-clock synchronization method according to a first embodiment of the present invention.

FIG. 3 is a schematic flow chart of a precise-clock synchronization method according to a first embodiment of the present invention. Referring to FIG. 3, the precise-clock synchronization method includes the following steps.

In step 301, a time stamp is obtained. The time stamp includes at least an original time stamp about the time when a master clock side transmits each Sync packet and a relative arrival time stamp about the time when each Sync packet is received.

The original time stamp is a time of transmitting the Sync packet stamped at the master clock side, that is, the time of the master clock. The relative time stamp is a local time when the slave clock side receives the Sync packet, that is, the time of the slave clock.

In step 302, it is determined whether a clock frequency at the slave clock side is synchronous with a clock frequency at the master clock side or not according to each original time stamp and its corresponding relative arrival time stamp.

In step 302, several manners are available for determining whether the clock frequency at the slave clock side and the clock frequency at the master clock side are synchronous or not according to each original time stamp and its corresponding relative arrival time stamp. For example, the determination may be formed through a changing trend of a relative delay, that is, a changing trend of a time difference between the original time stamp and the relative arrival time stamp. Alternatively, the determination may also be formed through comparison between a time interval of adjacent original time stamps and a time interval of similar adjacent relative arrival time stamps, and the like.

In step 303, if the clock frequency at the slave clock side and the clock frequency at the master clock side are asynchronous, the clock frequency at the slave clock side is adjusted to become synchronous with the clock frequency at the master clock side.

The precise-clock synchronization method provided in this embodiment is able to be applied in a situation not requiring the time synchronization of the master clock and the slave clock or having a low requirement on the time synchronization or having good time synchronization. As the frequency synchronization of the master clock and the slave clock may be realized by using the Sync packet only, the bandwidth is greatly saved. Especially when the network is deteriorated, a packet transmission frequency needs to be increased to obtain more sampling points to ensure clock synchronization quality, the advantage becomes more apparent.

Figure 4:
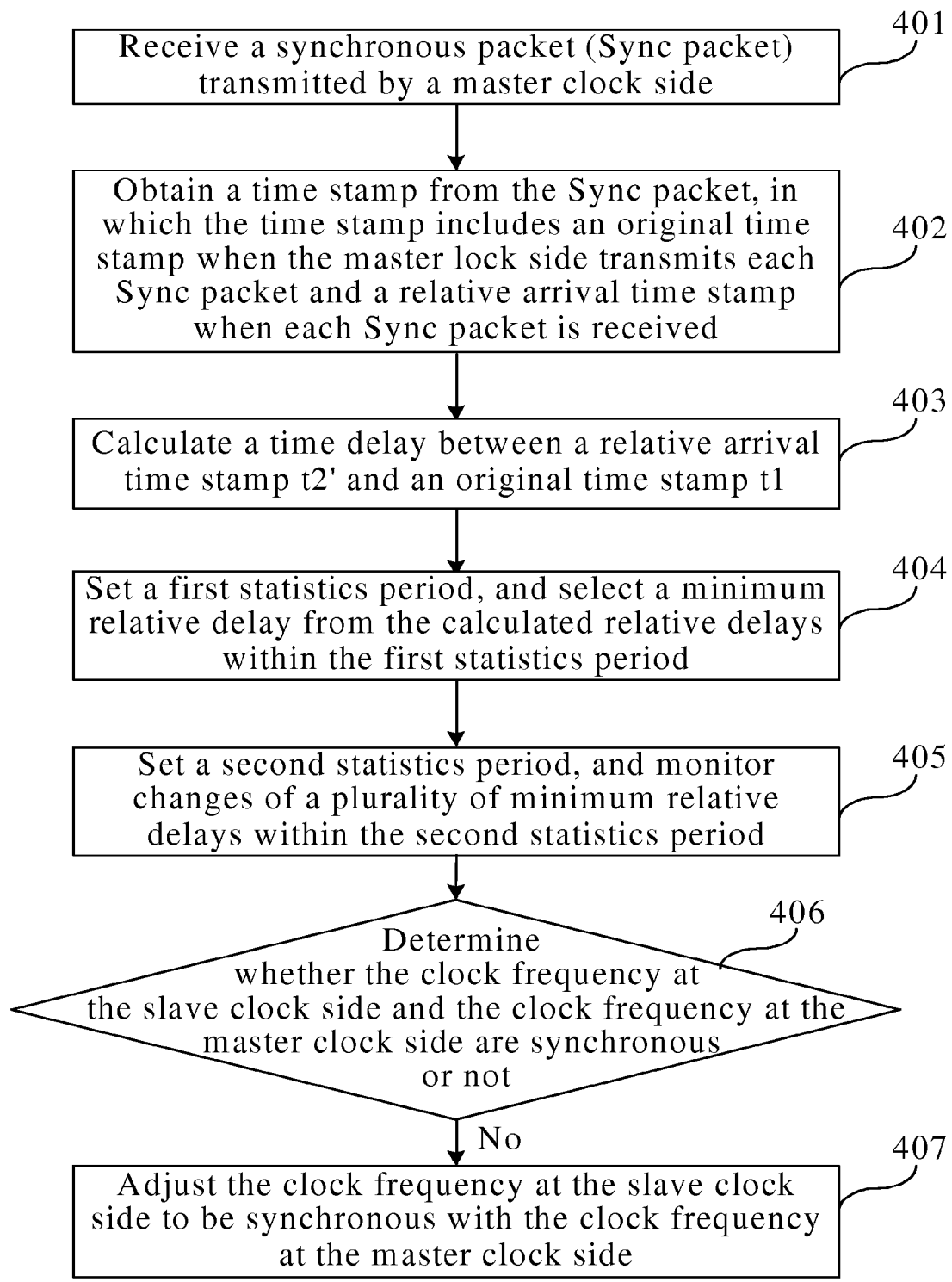
FIG. 4 is a schematic flow chart of a precise-clock synchronization method according to a second embodiment of the present invention.

FIG. 4 is a schematic flow chart of a precise-clock synchronization method according to a second embodiment of the present invention. Referring to FIG. 4, the precise-clock synchronization method includes the following steps.

In step 401, a Sync packet transmitted by a master clock side is received.

In step 402, a time stamp is obtained from the Sync packet. The time stamp includes an original time stamp about the time when the master clock side transmits each Sync packet and a relative arrival time stamp about the time when each Sync packet is received.

As shown in FIG. 1, the original time stamp of the Sync packet is a time t1 when the master clock side transmits the Sync packet. The relative arrival time stamp of the Sync packet is transmitted locally, that is, transmitted by the relative time stamp engine at the slave clock side. The relative time stamp engine does not need time setting and is only used for frequency synchronization. Therefore, the relative arrival time stamp obtained from the relative time stamp engine is indicated by t2', denoting a relative arrival time, rather than an absolute arrival time.

In step 403, a relative delay between the relative arrival time stamp t2' and the original time stamp t1 is calculated.

The relative delay=the relative arrival time stamp t2'−the original time stamp t1. Alternatively, the relative delay=the original time stamp t1−the relative arrival time stamp t2'. In the embodiment of the present invention, the equation that the relative delay=the relative arrival time stamp t2'−the original time stamp t1 is used.

In step 404, a first statistics period is set. Within the first statistics period, a minimum relative delay is selected from a plurality of calculated relative delays.

Within a certain statistics period, one minimum relative delay is selected from the plurality of relative delays calculated by using step 403 many times. The minimum relative delay represents the best network transmission performance, which is able to show the transmission delay characteristic of the physical layer more practically. It is equivalent to that the jittering of the network is filtered once.

In step 405, a second statistics period is set, and a changing trend of the minimum relative delay within the second statistics period is monitored.

The second statistics period in step 405 is a time period including a plurality of continuous first statistics periods. Within this time period of the second statistics period, the changing trend of the obtained minimum relative delay is monitored. The changing trend may include that the value of the minimum relative delay gradually increases or decreases.

In addition, before step 405, the method further includes filtering the selected minimum relative delay, so as to filter high frequency components. The first statistics period and second statistics period may be set by a timer respectively.

In step 406, it is determined whether the clock frequency at the slave clock side and the clock frequency at the master clock side are synchronous or not according to the changing trend of the minimum relative delay monitored in step 405.

Specifically, if the values of two adjacent minimum relative delays gradually increase or decrease, it indicates that the clock frequency at the slave clock side and the clock frequency at the master clock side are not synchronous, so step 407 is performed. If the value of the minimum relative delay is constant, it indicates that the clock frequency at the slave clock side and the clock frequency at the master clock side are synchronous.

In step 407, the clock frequency at the slave clock side is adjusted to become synchronous with the clock frequency at the master clock side.

In step 406, if it is found that the values of two adjacent minimum relative delays gradually increase by statistics, it indicates that the local relative time stamp engine, that is, the relative time stamp engine at the slave clock side runs is faster than the time engine at the master clock side, denoting that the frequency of the slave clock is higher than the frequency of the master clock. On the contrary, it denotes that the frequency of the slave clock is lower than the frequency of the master clock. Therefore, if the frequency of the slave clock is higher than the frequency of the master clock, in step 407, a variation of the minimum relative delay is converted into a signal value that can be identified by the oscillator. The output frequency of the local oscillator is then turned slower. The local oscillator may be a VCO or a DDS.

Figure 5:
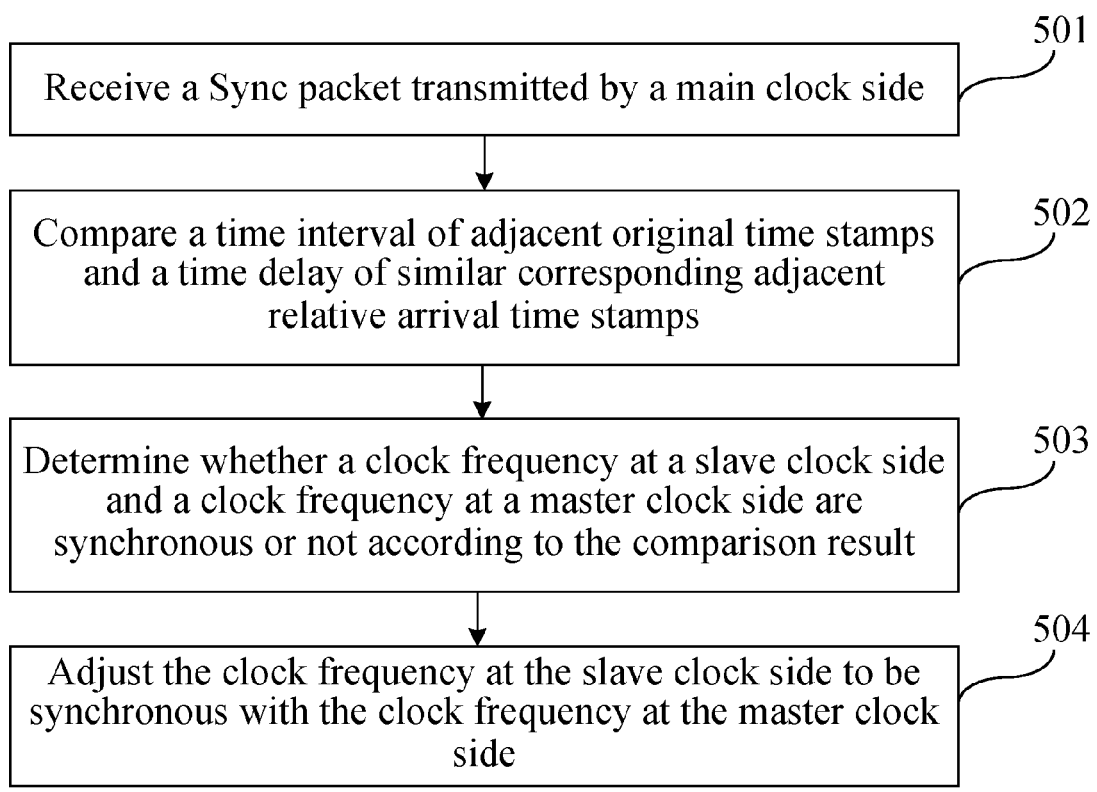
FIG. 5 is another schematic flow chart of the precise-clock synchronization method according to the second embodiment of the present invention.

FIG. 5 is another schematic flow chart of the precise-clock synchronization method according to a second embodiment of the present invention. Referring to FIG. 5, the precise-clock synchronization method includes the following steps.

In step 501, a Sync packet transmitted by a master clock side is received.

In step 502, a time interval of adjacent original time stamps and a time interval of similar corresponding adjacent relative arrival time stamps are compared.

In step 503, it is determined whether a clock frequency at a slave clock side and a clock frequency at the master clock side are synchronous or not according to a comparison result.

It is assumed that a periodic interval that the master clock side transmits the Sync packet is ΔTT. A time interval that the slave clock side receives the corresponding Sync packet is ΔTR. If the ΔTT is not equal to the ΔTR, it indicates that the clock frequency at the slave clock side and the clock frequency at the master clock side are asynchronous, and step 503 is performed. On the contrary, if the intervals are the same, it indicates that the clock frequency at the slave clock side and the clock frequency at the master clock side are synchronous.

In step 504, the clock frequency at the slave clock side is adjusted to become synchronous with the clock frequency at the master clock side.

For the precise-clock synchronization method provided in this embodiment, the frequency synchronization of the slave clock and the master clock may be performed as long as an original time stamp and a relative arrival time stamp of the Sync packet are obtained locally, that is, at the slave clock side. The method may be applied in a situation having low requirement on the time synchronization of clock or having good time synchronization, so the bandwidth may be greatly saved. Especially, when the network is deteriorated, the packet transmission frequency needs to be increased to obtain more sampling points to ensure clock synchronization quality, the advantages becomes more apparent.

Figure 6:
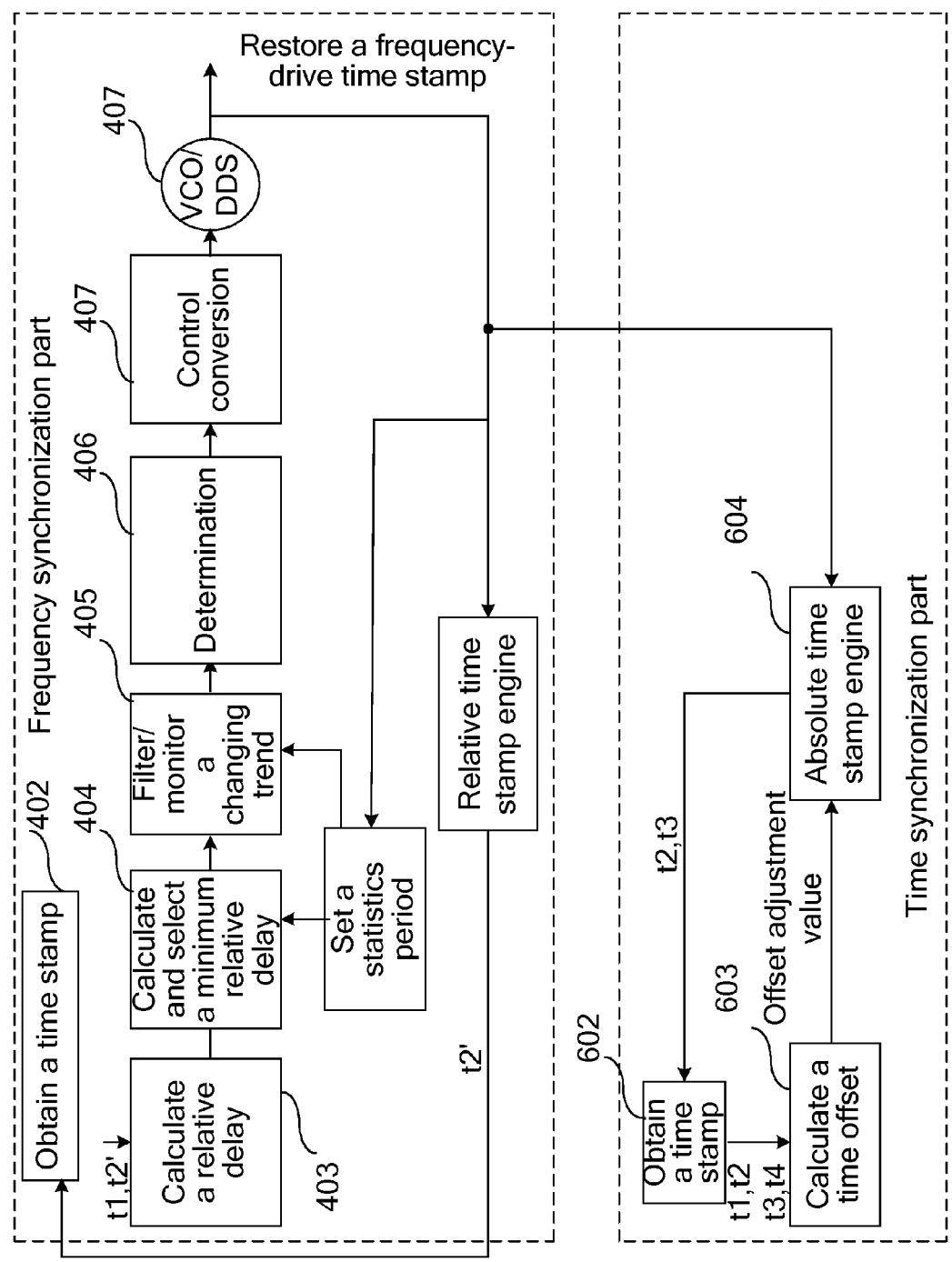
FIG. 6 is a schematic flow chart of a precise-clock synchronization method according to a third embodiment of the present invention.

FIG. 6 is a schematic flow chart of a precise-clock synchronization method according to a third embodiment of the present invention. Referring to FIG. 6, the differences between the flow in FIG. 6 and that in the second embodiment shown in FIGS. 4 and 5 are described as follows. The obtained time stamp further includes an absolute arrival time stamp, a Delay_Req time stamp, and a Delay_Resp time stamp of the Sync packet. After the frequency synchronization is accomplished, the time of the master clock and the slave clock may be synchronized according to the calculated time offset. Taking the precise-clock synchronization method in steps 401 to 407 as an example, the time synchronization has the following two situations.

In the first situation, the method further includes the following steps after receiving the Sync packet transmitted by the master clock side in step 401.

In step 601, a Delay_Req packet is transmitted, and a Delay_Resp packet returned by the master clock side after it receives the Delay_Req packet is received.

In step 602, a time stamp including an absolute arrival time stamp, a Delay_Req packet time stamp, and a Delay_Resp packet time stamp of the Sync packet is obtained.

The absolute arrival time stamp, the Delay_Req time stamp, and the Delay_Resp time stamp of the Sync packet are an accurate receiving time t2 when the slave clock side receives the Sync packet, a time t3 when the slave clock transmits the Delay_Req, and an accurate receiving time t4 of the master clock introduced in the synchronization message exchange scheme in the IEEE 1588 PTP, respectively.

In step 603, a time offset is calculated according to the obtained time stamp.

At this time, the time stamp used to calculate the time offset obtained in step 603 includes the original time stamp t1 obtained in step 402, the absolute arrival time stamp t2, the Delay_Req time stamp t3, and the Delay_Resp time stamp t4 obtained in step 602. The process of calculating the time offset according to t1, t2, t3, and t4 are as shown in FIGS. 1 and 2, and the description of which is not repeated here.

After the synchronization of the clock frequency at the slave clock side and the clock frequency at the master clock side in step 407 is performed, the method further includes step 604, in which a time synchronization enable signal is received, and the clock time of the slave clock side is adjusted to be synchronous with the clock time at the master clock side by using the time offset in step 603.

In FIG. 6, steps 401 and 601 among the steps are not shown.

In the second situation which is not shown in FIG. 6, after step 407 is performed so that the clock frequency at the slave clock side and the clock frequency at the master clock side are synchronous, the method further includes the following steps.

In step 601', a time synchronization enable signal is received.

In step 602', a Delay_Req is transmitted at the time when the time synchronization enable signal is received, and a Delay_Resp returned by the master clock side after it receives the Delay_Req is received.

In step 603', a time stamp including an original time stamp and an absolute arrival time stamp, a Delay_Req time stamp, and a Delay_Resp time stamp of the Sync packet is obtained.

In step 604', a time offset is calculated according to the obtained time stamp. The time stamp includes the original time stamp t1, the absolute arrival time stamp t2, the Delay_Req time stamp t3, and the Delay_Resp time stamp t4.

In step 605', the clock time at the slave clock side is adjusted to become synchronous with the clock time at the master clock side by using the time offset.

As can be seen from the precise-clock synchronization method provided in this embodiment, when the time and frequency of the master clock and the slave clock need to be synchronous, the relative delay time may be calculated according to the relative arrival time stamp of the Sync packet provided by the relative time stamp engine and the time offset may be calculated according to the absolute arrival time stamp of the Sync packet provided by the absolute time stamp engine at the same time. Next, after the frequencies of the master clock and the slave clock are synchronized by using the relative delay time, the time of the master clock and the slave clock are then synchronized by using the time offset according to the enable indication after the frequency synchronization is accomplished. Alternatively, the relative delay time may also be calculated first, and the time offset is then calculated to perform time synchronization on the master clock and the slave clock a relatively long time after the frequencies of the master clock and the slave clock are synchronized. In this way, the frequency synchronization and the time synchronization may be separately performed and do not interfere with each other, thus saving the bandwidth.

Figure 7:
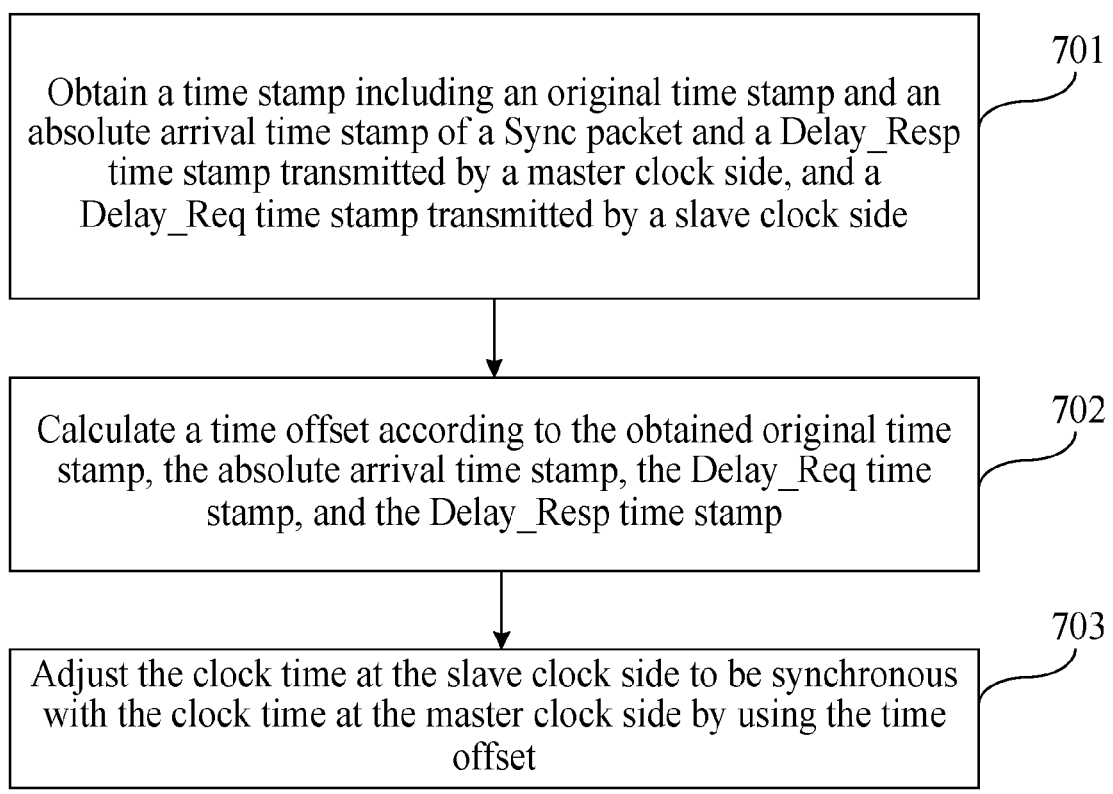
FIG. 7 is a schematic flow chart of a precise-clock synchronization method according to a fourth embodiment of the present invention.

FIG. 7 is a schematic flow chart of a precise-clock synchronization method according to a fourth embodiment of the present invention. Referring to FIG. 7, the precise-clock synchronization method includes the following steps.

In step 701, a time stamp including an original time stamp, an absolute arrival time stamp, and a Delay_Resp time stamp of a Sync packet transmitted by a master clock side, as well as a Delay_Req time stamp transmitted by the slave clock side are obtained.

The master clock side transmits the Sync packet. The slave clock side transmits a Delay_Req after receiving the transmitted Sync packet for a set period of time. The master clock side transmits a Delay_Resp after receiving the Delay_Req. The slave clock side receives the Delay_Resp. Time stamps, i.e. the time stamps obtained in step 701 are stamped in the packets.

In step 702, a time offset is calculated according to the obtained original time stamp, absolute arrival time stamp, Delay_Req time stamp, and Delay_Resp time stamp.

In step 703, the clock time at the slave clock side is adjusted to become synchronous with the clock time at the master clock side by using the time offset.

In this embodiment, the time of the master clock and the slave clock may be synchronized independently by calculating the obtained time stamps.

Before the clock time at the slave clock side is adjusted by using the time offset in step 703, or before the slave clock side transmits the Delay_Req, the method may further include receiving a time synchronization enable signal to enable the time synchronization process. The time that the time synchronization enable signal is received before the slave clock side transmits the Delay_Req is a time of the arrival set time. The time synchronization enable signal may be a completion indication for the synchronization between the clock frequency at the slave clock side and the clock frequency at the master clock side. From the descriptions of the precise-clock synchronization method in the first, second, and third embodiments, the method of realizing frequency synchronization of the master clock and the slave clock may be used in this embodiment to be combined with the time synchronization.

Figure 8:
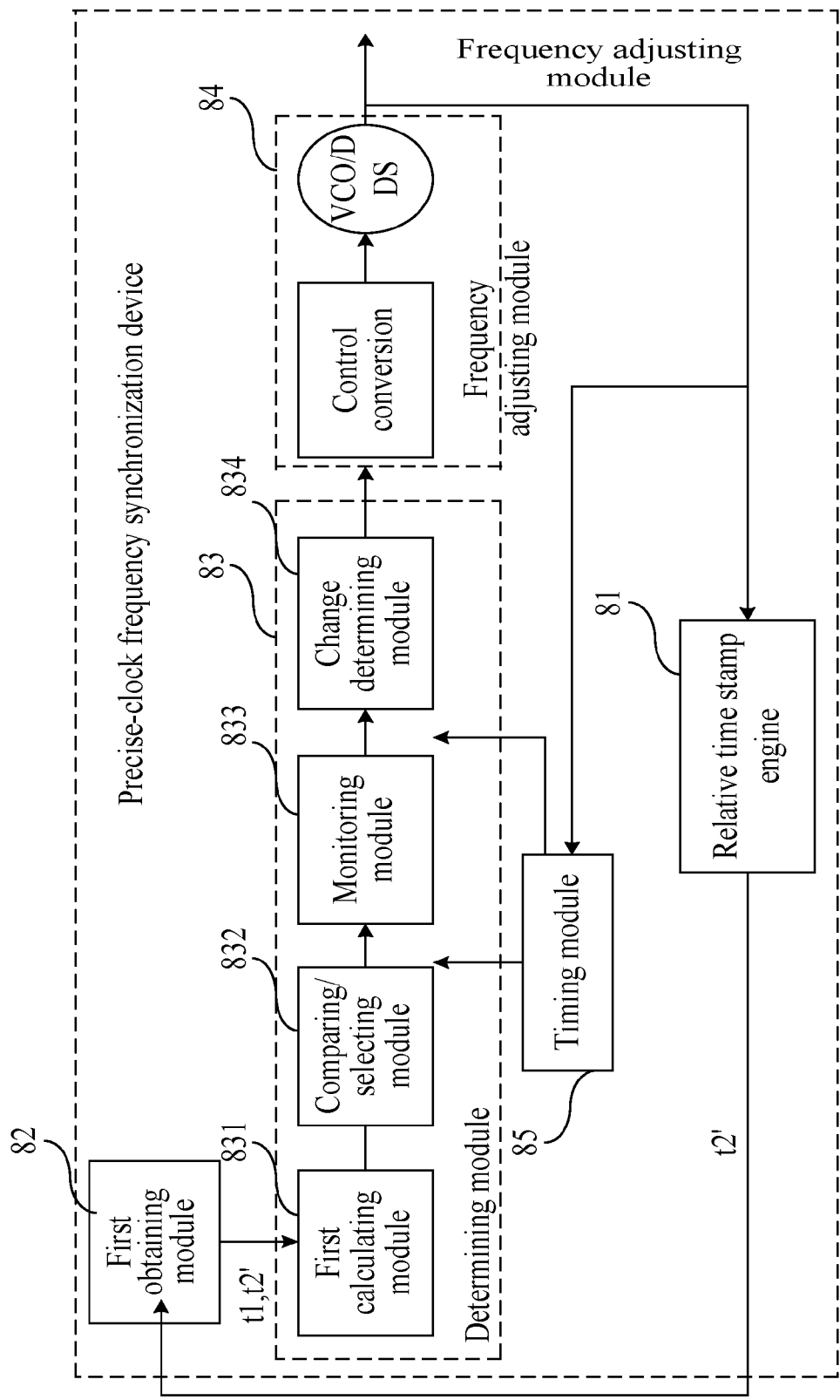
FIG. 8 is a schematic structural view of a precise-clock frequency synchronization device according to an embodiment of the present invention.

FIG. 8 is a schematic structural view of a precise-clock frequency synchronization device according to an embodiment of the present invention. Referring to FIG. 8, the precise-clock frequency synchronization device includes a relative time stamp engine 81, a first obtaining module 82, a determining module 83, and a frequency adjusting module 84. The relative time stamp engine 81 provides a relative arrival time stamp about the time when the slave clock side receives a Sync packet. The first obtaining module 82 obtains a time stamp, and the time stamp includes at least an original time stamp about the time when the master clock side transmits each Sync packet and a relative arrival time stamp about the time when the slave clock side receives each Sync packet. The determining module 83 determines whether the clock frequency at the slave clock side and the clock frequency at the master clock side are synchronous or not according to each original time stamp and its corresponding relative arrival time stamp. The frequency adjusting module 84 adjusts the clock frequency at the slave clock side to be synchronous with the clock frequency at the master clock side if the clock frequency at the slave clock side and the clock frequency at the master clock side are asynchronous. A plurality of manners exists for the determining module 83 to determine whether the clock frequency at the slave clock side and the clock frequency at the master clock side are synchronous or not according to each original time stamp and its corresponding relative arrival time stamp. For example, the determination may be formed through a changing trend of the relative delay, that is, a changing trend of a time difference between the original time stamp and the relative arrival time stamp. Alternatively, the determination may be formed through the comparison between a time interval of the adjacent original time stamps and a time interval of similar corresponding adjacent relative arrival time stamps, and the like.

In this embodiment, the determining module 83 in the precise-clock frequency synchronization device specifically includes a first calculating module 831, a comparing/selecting module 832, a monitoring module 833, and a change determining module 834. The first calculating module 831 calculates a relative delay between the relative arrival time stamp and the original time stamp. The comparing/selecting module 832 selects a minimum relative delay from a plurality of calculated relative delays within a first statistics period. The monitoring module 833 monitors changes of the plurality of minimum relative delays within a second statistics period. The change determining module 834 determines whether the clock frequency at the slave clock side and the clock frequency at the master clock side are synchronous or not according to a changing trend of the plurality of minimum relative delay. If values of two adjacent minimum relative delays gradually increase or decrease, it indicates that the clock frequency at the slave clock side and the clock frequency at the master clock side are asynchronous. If a value of the minimum relative delay is constant, it indicates that the clock frequency at the slave clock side and the clock frequency at the master clock side are synchronous. The monitoring module 833 further has a function of filtering the selected minimum relative delays to filter high frequency components.

In this embodiment, the precise-clock frequency synchronization device further includes a timing module 85 adapted to set the first statistics period and the second statistics period.

The specific process that the precise-clock frequency synchronization device provided in this embodiment performs frequency synchronization of the master clock and the slave clock is as described in the embodiments of the methods, which may be separately applied in the situation not requiring the time synchronization of the master clock and the slave clock or having low requirement on the time synchronization or having good time synchronization. As the use of the Sync packet may realize the frequency synchronization of the master clock and the slave clock, the bandwidth is greatly saved. Especially when the network is deteriorated and packet transmission frequency needs to be increased to ensure the clock quality, the advantage becomes more apparent.

Figure 9:
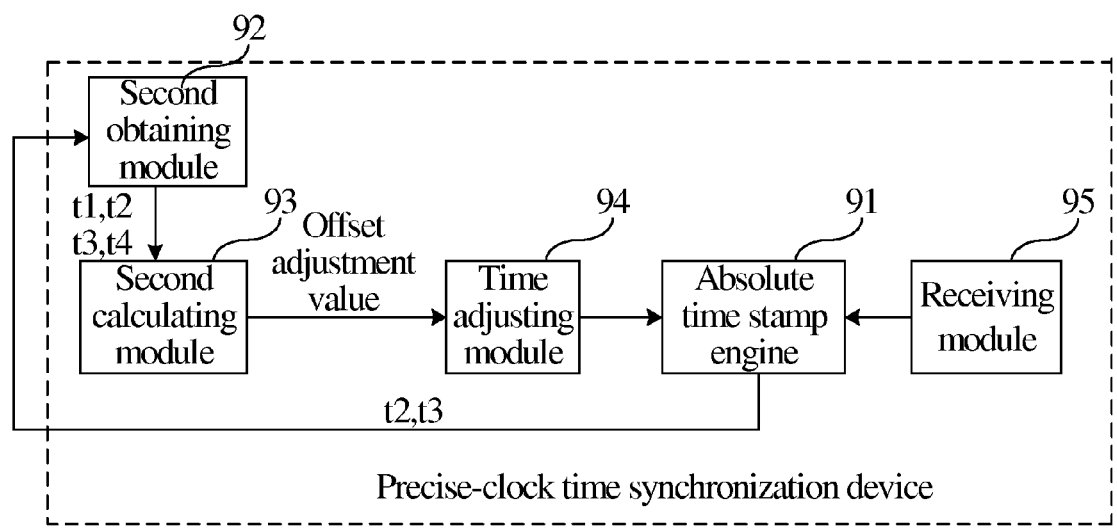
FIG. 9 is a schematic structural view of a precise-clock time synchronization device according to an embodiment of the present invention.

FIG. 9 is a schematic structural view of a precise-clock time synchronization device according to an embodiment of the present invention. Referring to FIG. 9, the precise-clock time synchronization device includes an absolute time stamp engine 91, a second obtaining module 92, a second calculating module 93, and a time adjusting module 94. The absolute time stamp engine 91 provides an absolute arrival time stamp about the time when a slave clock side receives a Sync packet and a Delay_Req time stamp about the time when the slave clock side transmits a Delay_Req. The second obtaining module 92 obtains a time stamp including an original time stamp and an absolute arrival time stamp of the Sync packet transmitted by the master clock side, a Delay_Resp time stamp transmitted by the master clock side, and a Delay_Req time stamp transmitted by the slave clock side. The second calculating module 93 calculates a time offset according to the obtained original time stamp, absolute arrival time stamp, Delay_Req time stamp, and Delay_Resp time stamp. The time adjusting module 94 adjusts the clock time at the slave clock side to be synchronous with the clock time at the master clock side by using the time offset.

In this embodiment, the precise-clock time synchronization device further includes a receiving module 95 adapted to receive a time synchronization enable signal.

The specific process that the precise-clock time synchronization device provided in this embodiment performs time synchronization of the master clock and the slave clock is as described in the methods in the embodiments. The time of the master clock and the slave clock may be synchronized separately by calculating the obtained time stamps.

Figure 10:
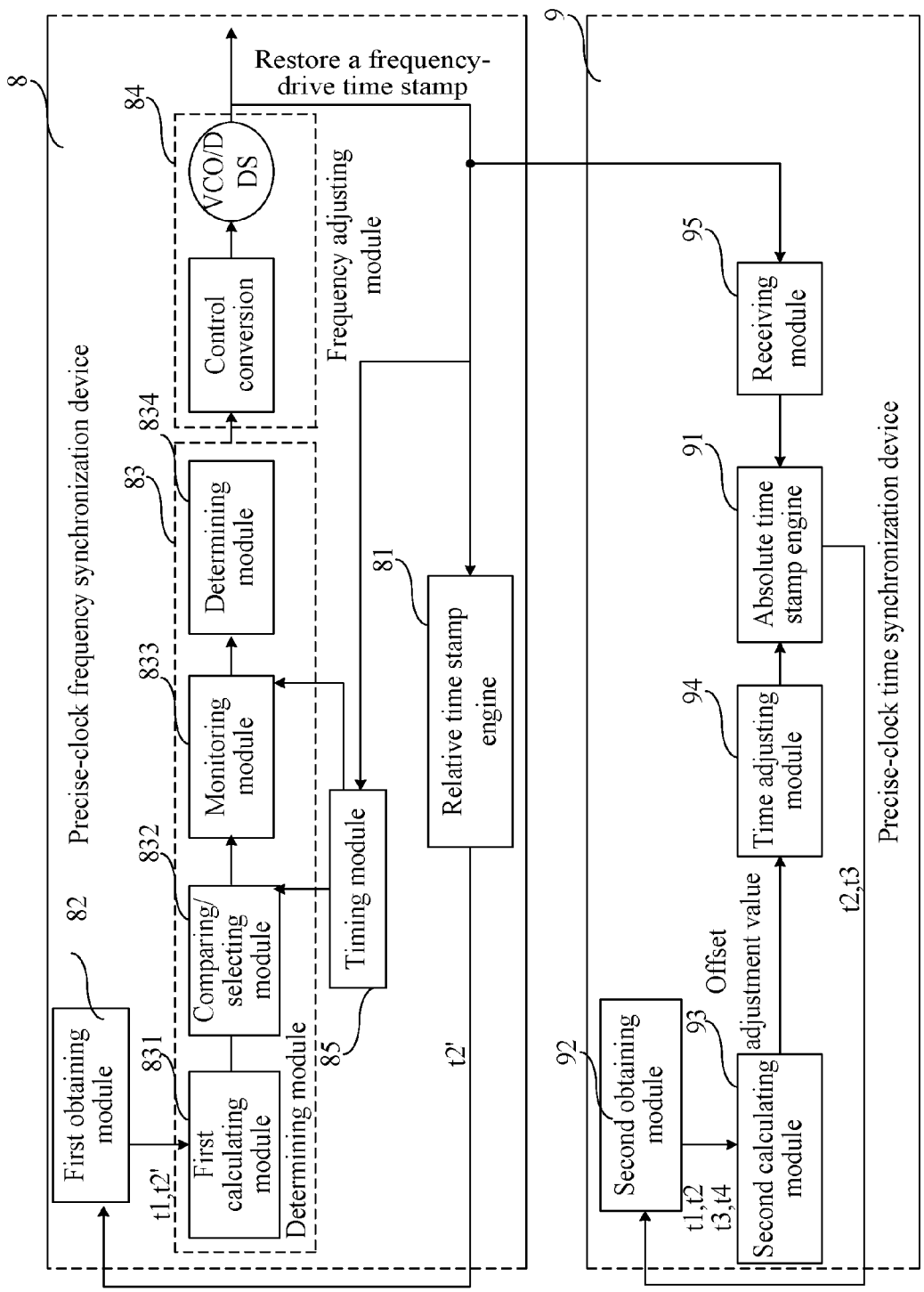
FIG. 10 is a schematic structural view of a precise-clock synchronization system according to an embodiment of the present invention.

FIG. 10 is a schematic structural view of a precise-clock synchronization system according to an embodiment of the present invention. Referring to FIG. 10, the precise-clock synchronization system includes a precise-clock frequency synchronization device 8 and a precise-clock time synchronization device 9. The precise-clock frequency synchronization device 8 adjusts a clock frequency at a slave clock side to be synchronous with a clock frequency at a master clock side according to an original time stamp about the time when the master clock side transmits a Sync packet and a relative arrival time stamp about the time when the slave clock side receives the Sync packet. The precise-clock time synchronization device 9 calculates a time offset according to the original time stamp of the Sync packet and an absolute arrival time stamp about the time when the slave clock side receives the Sync packet, as well as a Delay_Req time stamp and a Delay_Resp time stamp, and adjusts the clock time at the slave clock side to be synchronous with the clock time at the master clock side by using the time offset. Specific structures of the precise-clock frequency synchronization device 8 and the precise-clock time synchronization device 9 are described in the embodiment of the precise-clock frequency synchronization device shown in FIG. 8 and the embodiment of the precise-clock time synchronization device shown in FIG. 9, and the descriptions of which are not repeated here.

The specific process of the precise-clock synchronization system provided in this embodiment performing frequency synchronization, time synchronization and their combination of the master clock and the slave clock is as described in the embodiments of the methods. When the time and frequency of the master clock and the slave clock need to be synchronized, the relative delay time may be calculated according to the relative arrival time stamp of the Sync packet provided by the relative time stamp engine and the time offset may be calculated according to the absolute arrival time stamp of the Sync packet provided by the absolute time stamp engine at the same time. Next, after the frequencies of the master clock and the slave clock are synchronized by using the relative delay time, the time of the master clock and the slave clock are then synchronized by using the time offset according to an enable indication after the frequency synchronization is accomplished. Alternatively, the relative delay time may be calculated first, and the time offset is then calculated to perform time synchronization of the master clock and the slave clock, after accomplishing the frequency synchronization of the master clock and the slave clock for a long time. In this way, the frequency synchronization and the time synchronization may be separately processed and do not interfere with each other, thus saving the bandwidth.

Those of ordinary skill in the art should understand that all or a part of processes in the method according to the embodiments may be implemented by a computer program instructing relevant hardware. The program may be stored in a computer readable storage medium. When the program is executed, the processes of the methods according to the embodiments of the present invention are performed. The storage medium may be a magnetic disk, an optical disk, a read-only memory (ROM), a random access memory (RAM), or the like.

Finally, it should be noted that the above embodiments are merely provided for describing the technical solutions of the present invention, but not intended to limit the present invention. It should be understood by those of ordinary skill in the art that although the present invention has been described in detail with reference to the foregoing embodiments, modifications can be made to the technical solutions described in the foregoing embodiments, or equivalent replacements can be made to some technical features in the technical solutions, and such modifications or replacements do not cause the essence of corresponding technical solutions to depart from the spirit and scope of the present invention.

What is claimed is:

1. A precise-clock synchronization method, comprising:

obtaining a time stamp, wherein the time stamp comprises at least an original time stamp about the time when a master clock side transmits a synchronous (Sync) packet and a relative arrival time stamp about the time when a slave clock side receives the Sync packet;

synchronizing the clock frequency at the slave clock side with the clock frequency at the master clock side, if the clock frequency at the slave clock side and the clock frequency at the master clock side are asynchronous;

transmitting a delay request (Delay_Req) packet, and receiving a delay response (Delay_Resp) packet returned by the master clock side after it receives the Delay_Req packet;

obtaining the time stamp including the original time stamp, the relative arrival time stamp and an absolute arrival time stamp of the Sync packet, a Delay_Resp time stamp, and a Delay_Req time stamp;

calculating a time offset according to the original time stamp, the absolute arrival time stamp, the Delay_Resp time stamp, and the Delay_Req time stamp; and synchronizing the clock time at the slave clock side with the clock time at the master clock side by using the time offset, wherein synchronizing the clock frequency at the slave clock side with the clock frequency at the master clock side comprises:

calculating a relative delay between the relative arrival time stamp and the original time stamp;

setting a first statistics period having a minimum relative delay selected from a plurality of calculated relative delays;

setting a second statistics period, and monitoring a changing trend of the minimum relative delay within the second statistics period; and determining whether the clock frequency at the slave clock side and the clock frequency at the master clock side are synchronous or not according to the changing trend of the minimum relative delay.

2. The precise-clock synchronization method according to claim 1, wherein if the clock frequency at the slave clock side and the clock frequency at the master clock side are asynchronous, the method comprises:

determining that the clock frequency at the slave clock side and the clock frequency at the master clock side are not synchronous, if the values of two adjacent minimum relative delays are not substantially the same.

3. The precise-clock synchronization method according to claim 1, wherein the calculating a relative delay between the relative arrival time stamp and the original time stamp comprises:

getting the relative delay through calculating the absolute value of the difference between the relative arrival time stamp and the original time stamp.

4. The precise-clock synchronization method according to claim 1, wherein before setting the second statistics period, the method further comprises:

filtering the selected minimum relative delay.

5. A precise-clock frequency synchronization device, comprising:

a relative time stamp engine, adapted to provide a relative arrival time stamp about the time when the slave clock side receives a synchronous (Sync) packet;

a first obtaining module, adapted to obtain a time stamp, wherein the time stamp comprises at least an original time stamp about the time when the master clock side transmits each Sync packet and the relative arrival time stamp about the time when the slave clock side receives the Sync packet;

a determining module, adapted to determine whether the clock frequency at the slave clock side and the clock frequency at the master clock side are synchronous or not according to each original time stamp and its corresponding relative arrival time stamp;

a frequency adjusting module, adapted to synchronize the clock frequency at the slave clock side with the clock frequency at the master clock side, if the clock frequency at the slave clock side and the clock frequency at the master clock side are asynchronous; and a timing module adapted to set a first statistics period and a second statistics period, wherein the determining module comprises:

a first calculating module, adapted to calculate a relative delay between the relative arrival time stamp and the original time stamp;

a comparing/selecting module, adapted to select a minimum relative delay from a plurality of calculated relative delays within the first statistics period;

a monitoring module, adapted to monitor changes of the plurality of minimum relative delays within the second statistics period; and a change determining module, adapted to determine whether the clock frequency at the slave clock side and the clock frequency at the master clock side are synchronous or not according to a changing trend of the plurality of minimum relative delay.

6. A precise-clock synchronization system, comprising:

a precise-clock frequency synchronization device, adapted to synchronize a clock frequency at a slave clock side with a clock frequency at a master clock side, according to an original time stamp about a time when the master clock side transmits a synchronous (Sync) packet and a relative arrival time stamp about a time when the slave clock side receives the Sync packet; and a precise-clock time synchronization device, adapted to calculate a time offset according to the original time stamp of the Sync packet and an absolute arrival time stamp about the time when the slave clock side receives the Sync packet, as well as a delay request (Delay_Req) time stamp and a delay response (Delay_Resp) time stamp, and adjust the clock time at the slave clock side to be synchronous with the clock time at the master clock side by using the time offset, wherein synchronizing the clock frequency at the slave clock side with the clock frequency at the master clock side comprises:

calculating a relative delay between the relative arrival time stamp and the original time stamp;

setting a first statistics period having a minimum relative delay selected from a plurality of calculated relative delays;

setting a second statistics period, and monitoring a changing trend of the minimum relative delay within the second statistics period; and determining whether the clock frequency at the slave clock side and the clock frequency at the master clock side are synchronous or not according to the changing trend of the minimum relative delay.

7. The precise-clock synchronization system according to claim 6, wherein the precise-clock frequency synchronization device comprises:
- a relative time stamp engine, adapted to provide a relative arrival time stamp about the time when the slave clock side receives the Sync packet;
- a first obtaining module, adapted to obtain a time stamp, wherein the time stamp comprises at least the original time stamp about the time when the master clock side transmits the Sync packet and the relative arrival time stamp about the time when the slave clock side receives the Sync packet;
- a determining module, adapted to determine whether the clock frequency at the slave clock side and the clock frequency at the master clock side are synchronous or not according to the original time stamp and its corresponding relative arrival time stamp; and
- a frequency adjusting module, adapted to synchronize the clock frequency at the slave clock side with the clock frequency at the master clock side, if the clock frequency at the slave clock side and the clock frequency at the master clock side are asynchronous.

8. The precise-clock synchronization system according to claim 6, the precise-clock time synchronization device comprises:
- an absolute time stamp engine, adapted to provide an absolute arrival time stamp about the time when the slave clock side receives the Sync packet and the Delay_Req time stamp about the time when the slave clock side transmits a Delay_Req;
- a second obtaining module, adapted to obtain an original time stamp and an absolute arrival time stamp of the Sync packet transmitted by the master clock side, a Delay_Resp time stamp transmitted by the master clock side, and a Delay_Req time stamp transmitted by the slave clock side;
- a second calculating module, adapted to calculate a time offset according to the obtained original time stamp, the absolute arrival time stamp, the Delay_Req time stamp, and the Delay_Resp time stamp; and
- a time adjusting module, adapted to synchronize the clock time at the slave clock side with the clock time at the master clock side by using the time offset.

\* \* \* \* \*